(12) United States Patent
Lacrampe

(10) Patent No.: US 10,714,641 B2
(45) Date of Patent: Jul. 14, 2020

(54) MULTILAYER TRANSPARENT POLYESTER FILM, METHOD FOR MANUFACTURING SAID FILM AND USE OF SAID FILM IN PARTICULAR IN THE BACKSHEETS OF PHOTOVOLTAIC PANELS

(71) Applicant: TORAY FILMS EUROPE, Saint Maurice de Beynost (FR)

(72) Inventor: Valérie Lacrampe, Vernaison (FR)

(73) Assignee: TORAY FILMS EUROPE, Saint Maurice de Beynost (FR)

( * ) Notice: Subject to any disclaimer, the term of this patent is extended or adjusted under 35 U.S.C. 154(b) by 299 days.

(21) Appl. No.: 15/115,373

(22) PCT Filed: Jan. 30, 2015

(86) PCT No.: PCT/EP2015/051984
§ 371 (c)(1),
(2) Date: Jul. 29, 2016

(87) PCT Pub. No.: WO2015/114113
PCT Pub. Date: Aug. 6, 2015

(65) Prior Publication Data
US 2017/0012151 A1    Jan. 12, 2017

(30) Foreign Application Priority Data

Jan. 31, 2014 (FR) ..................... 14 00276

(51) Int. Cl.
*H01L 31/049* (2014.01)
*B32B 27/08* (2006.01)
(Continued)

(52) U.S. Cl.
CPC ............ *H01L 31/049* (2014.12); *B32B 27/08* (2013.01); *B32B 27/18* (2013.01); *B32B 27/20* (2013.01);
(Continued)

(58) Field of Classification Search
None
See application file for complete search history.

(56) References Cited

U.S. PATENT DOCUMENTS 4,067,855 A * 1/1978 Miwa ................. C08K 5/52
528/275
4,138,386 A * 2/1979 Motegi ............... C08K 13/02
523/181
(Continued)

FOREIGN PATENT DOCUMENTS

EP    1 287 983 A2    3/2003
EP    2 407 515 A1    1/2012
(Continued)

OTHER PUBLICATIONS

Mar. 20, 2015 Search Report issued in International Patent Application No. PCT/EP2015/051984.
(Continued)

*Primary Examiner* — Vivian Chen
(74) *Attorney, Agent, or Firm* — Oliff PLC

(57) ABSTRACT

A biaxially oriented multilayer transparent film including at least two layers of polyester, respectively a core layer and at least one outer layer, which can be identical or different, wherein: i) at least the core layer includes at least one biaxially oriented transparent polyester PE1, ii) at least one of the outer layers includes, on the one hand, at least one biaxially oriented polyester PE2, and, on the other hand, particles coming from the reaction between at least one metal compound and at least one monomeric or oligomeric unit of PE2, the particles having more preferably a d50—as µm and following an order of preference—between 0.5 and 5; between 1.0 and 4, and between 1.5 and 3.0. Also relates to the manufacture of this film and its applications as a laminate in particular in the backsheets of photovoltaic cells.

7 Claims, 1 Drawing Sheet

(51) Int. Cl.

| | | |
|---|---|---|
| *B32B 27/18* | (2006.01) | |
| *B32B 27/36* | (2006.01) | |
| *B32B 27/20* | (2006.01) | |
| *B32B 37/15* | (2006.01) | |
| *B32B 38/00* | (2006.01) | |
| *C08L 67/02* | (2006.01) | |
| *C08L 67/03* | (2006.01) | |
| *C08K 3/013* | (2018.01) | |
| *C08K 5/00* | (2006.01) | |
| *C08K 5/09* | (2006.01) | |
| *B29C 48/18* | (2019.01) | |
| *C08K 3/32* | (2006.01) | |
| *C08K 3/014* | (2018.01) | |
| *C08K 5/521* | (2006.01) | |
| *C08K 5/52* | (2006.01) | |
| *B29C 48/16* | (2019.01) | |
| *C08K 5/098* | (2006.01) | |
| *B29D 7/01* | (2006.01) | |
| *B29K 67/00* | (2006.01) | |

(52) U.S. Cl.
CPC ............. *B32B 27/36* (2013.01); *B29C 48/16* (2019.02); *B29C 48/18* (2019.02); *B29D 7/01* (2013.01); *B29K 2067/00* (2013.01); *B29K 2067/003* (2013.01); *B32B 37/15* (2013.01); *B32B 37/153* (2013.01); *B32B 2038/0028* (2013.01); *B32B 2038/0048* (2013.01); *B32B 2250/02* (2013.01); *B32B 2250/03* (2013.01); *B32B 2250/244* (2013.01); *B32B 2250/40* (2013.01); *B32B 2264/00* (2013.01); *B32B 2264/102* (2013.01); *B32B 2264/104* (2013.01); *B32B 2270/00* (2013.01); *B32B 2307/40* (2013.01); *B32B 2307/412* (2013.01); *B32B 2307/518* (2013.01); *B32B 2307/71* (2013.01); *B32B 2307/746* (2013.01); *B32B 2367/00* (2013.01); *B32B 2457/12* (2013.01); *C08K 3/013* (2018.01); *C08K 3/014* (2018.01); *C08K 3/32* (2013.01); *C08K 5/005* (2013.01); *C08K 5/09* (2013.01); *C08K 5/098* (2013.01); *C08K 5/52* (2013.01); *C08K 5/521* (2013.01); *C08K 2003/321* (2013.01); *C08K 2003/324* (2013.01); *C08K 2003/329* (2013.01); *C08L 67/02* (2013.01); *C08L 67/03* (2013.01); *C08L 2201/08* (2013.01); *C08L 2201/10* (2013.01); *C08L 2203/16* (2013.01); *C08L 2203/204* (2013.01); *C08L 2205/02* (2013.01); *Y02E 10/50* (2013.01); *Y10T 428/24355* (2015.01); *Y10T 428/24413* (2015.01); *Y10T 428/25* (2015.01); *Y10T 428/258* (2015.01); *Y10T 428/31786* (2015.04)

(56) References Cited

U.S. PATENT DOCUMENTS

| | | | | |
|---|---|---|---|---|
| 4,454,312 A * | 6/1984 | Kuze | ............ | C08J 5/18 528/275 |
| 4,497,865 A * | 2/1985 | Minami | ................ | B29C 55/005 264/210.7 |
| 4,818,581 A * | 4/1989 | Katoh | .................. | C08J 5/18 428/143 |
| 5,006,589 A * | 4/1991 | Sakamoto | ............. | G11B 5/733 428/212 |
| 6,036,905 A * | 3/2000 | Park | .................. | C08G 63/20 264/165 |
| 6,083,617 A * | 7/2000 | Aoyama | ................... | C08J 5/18 423/700 |
| 9,212,268 B2 * | 12/2015 | Takahashi | ............... | B29C 55/12 |
| 9,530,917 B2 * | 12/2016 | Horie | ..................... | B32B 27/36 |
| 9,608,153 B2 * | 3/2017 | Lacrampe | ............ | H01L 31/049 |
| 2003/0044628 A1 | 3/2003 | Butera et al. | | |
| 2007/0237972 A1 * | 10/2007 | Kliesch | ................... | B32B 27/18 428/480 |
| 2009/0011228 A1 | 1/2009 | Eveson et al. | | |
| 2010/0120946 A1 * | 5/2010 | Kliesch | ....................... | C08J 5/18 523/400 |
| 2010/0120967 A1 * | 5/2010 | Kinoshita | ............ | C08G 63/187 524/493 |
| 2010/0189998 A1 | 7/2010 | MacKerron et al. | | |
| 2010/0326501 A1 * | 12/2010 | Zhao | ....................... | B32B 27/36 136/252 |
| 2011/0064958 A1 * | 3/2011 | Hirose | .................... | C23C 14/10 428/446 |
| 2011/0192459 A1 * | 8/2011 | Park | ....................... | B32B 27/36 136/256 |
| 2011/0303102 A1 * | 12/2011 | Amedeo | .................... | A23L 3/01 99/451 |
| 2011/0305913 A1 * | 12/2011 | Hinton | ................ | B29C 47/0021 428/480 |
| 2011/0313102 A1 | 12/2011 | Kojima et al. | | |
| 2012/0021197 A1 * | 1/2012 | Matsumura | ............. | B32B 27/20 428/213 |
| 2012/0080089 A1 * | 4/2012 | Aoyama | ..................... | C08J 5/18 136/256 |
| 2012/0114977 A1 * | 5/2012 | Mitsuoka | ................... | C08J 5/18 428/847.2 |
| 2012/0177932 A1 * | 7/2012 | Masuda | ................... | B32B 27/36 428/423.7 |
| 2012/0178897 A1 * | 7/2012 | Nozawa | ................ | H01L 31/049 528/308.1 |
| 2012/0202083 A1 * | 8/2012 | Shiomi | .................... | B29C 55/12 428/480 |
| 2012/0208943 A1 * | 8/2012 | Kojima | ................... | C08G 63/20 524/417 |
| 2013/0012665 A1 * | 1/2013 | Nozawa | ................... | C08G 63/85 525/437 |
| 2013/0139883 A1 * | 6/2013 | Togawa | .................... | C08J 5/18 136/256 |
| 2013/0281635 A1 * | 10/2013 | Yoshimura | ........... | C08G 63/183 525/437 |
| 2013/0323487 A1 * | 12/2013 | Takahashi | ................. | G02B 1/04 428/212 |
| 2013/0340830 A1 * | 12/2013 | Aritoshi | ................... | B32B 27/36 136/259 |
| 2014/0295174 A1 | 10/2014 | Eveson et al. | | |
| 2015/0068601 A1 * | 3/2015 | Ikehata | ................... | B32B 27/08 136/259 |
| 2017/0152075 A1 * | 6/2017 | Moritz | ...................... | B32B 7/12 |

FOREIGN PATENT DOCUMENTS

| | | | |
|---|---|---|---|
| JP | 2003-182012 A | * | 7/2003 |
| JP | 2012-041520 A | * | 3/2012 |
| JP | 2012-057021 A | * | 3/2012 |
| JP | 2013-189521 A | * | 9/2013 |
| WO | 2007/091082 A1 | | 8/2007 |
| WO | WO 2012/081529 A | * | 6/2012 |
| WO | WO 2012/114988 A | * | 8/2012 |

OTHER PUBLICATIONS

Mar. 20, 2015 Written Opinion issued in International Patent Application No. PCT/EP2015/051984.

* cited by examiner

US 10,714,641 B2

MULTILAYER TRANSPARENT POLYESTER FILM, METHOD FOR MANUFACTURING SAID FILM AND USE OF SAID FILM IN PARTICULAR IN THE BACKSHEETS OF PHOTOVOLTAIC PANELS

FIELD OF THE INVENTION

This invention relates to polyester films, in particular aromatic polyester films such as polyethylene terephthalate (PET) or polyethylene naphthalate (PEN) or polybutylene terephthalate (PBT) (preferably with biaxial orientation), which are very widely used on account of their well-known excellent properties of thermal stability, dimensional stability, chemical resistance and relatively high surface energy as protective films against a great variety of elements, for example protective films useful as backsheets for photovoltaic panels (modules). These backsheets provide for the mechanical integrity of the photovoltaic panel (module), protection of the solar cells and contribute to global light reflectance of the photovoltaic panel (module).

The invention also relates to the manufacture and the use of these polyester films.

DESCRIPTION OF THE TECHNICAL PROBLEM AND PRIOR ART

There is a need for biaxially oriented multilayer transparent polyester film, having at least one of the following properties:
  (a) high transparency level and low haze level, in such a way that it possible to see through it;
  (b) easy handing, in terms of their manufacture, their conditioning and their applications.
  (c) hydrolysis resistance;
  (d) light stability;
  (e) good adhesion properties;

In recent years, photovoltaic (PV) panels (modules) comprised of PV cells have had a certain degree of success, as next generation clean energy sources.

The structure of the photovoltaic cell is a laminate comprising (i) a transparent material of which the outer surface is that intended to be exposed to light, (ii) the semiconductor layers, (iii) a resin layer including a filler and (iv) a protective backsheet constituted of a laminated assembly of polymer films intended to favour the integrity and the rigidity of the panel and having a minimal loss of performance in the presence of humidity, heat and UV radiation.

The PV panels can be opaque when at least one of the elements (ii) (iii) (iv) is opaque. If the elements (ii) (iii) (iv) are transparent, then the PV panels comprised of these PV cells are transparent and can be used in the building instead of glass.

The polymer films assembled to form the backsheet of the PV panel (iv), can be comprised of a thermoplastic resin, in particular made of polyester, in particular an aromatic polyester, such as polyethylene terephthalate (PET) or polyethylene naphthalate (PEN) or polybutylene terephthalate (PBT) (more preferably, with a biaxial orientation). This can be for example PET multilayer films, made opaque thanks to the incorporation of fillers, or transparent films.

Beyond their transparency or their opacity, there is a demand in the market for protective multilayer polyester films for the backsheets of PV cells, which have all or a portion of the aforementioned properties (b) to (e).

Multilayer polyester films can be improved in particular with regards to these properties (a) to (e).

Document EP 1 287 983 B1 relates to low Haze PET films (turbidity) for a wide variety of applications such as labels, certain optical applications such as solar control films, etc. Transparency is obtained here by using special fillers. This film is for example a three layered symmetrical structure, wherein the two outer layers excluding the core layer, contain a mixture of inorganic and organic particles. The inorganic particles are selected from the group consisting of aluminium oxide, silicon dioxide, zirconium oxide, titanium dioxide, tin oxide, calcium carbonate, barium sulphate, calcium phosphate, zeolite, hydroxy apatite, aluminium silicate and mixtures thereof, of average particle size of about 0.035 µm to about 0.3 µm. The organic particles have a particle size of less than or equal to about 0.8 µm and are present in an amount less than about 0.04%. This film which has an extra-low Haze (turbidity) is however not resistant to hydrolysis or UV. Its ease of handling is not optimised.

EP2407515A1 discloses a polyester resin composition comprising an alkali metal phosphate in an amount of 1.3 mol/tonne to 6.0 mol/tonne, phosphoric acid in an amount of 1.8 mol/tonne to 7.5 mol/tonne. The increase in COOH radicals in this composition, before and after a wet-heating treatment performed at 155° C. for 4 hours under saturated steam, is 90 eq./ton or less. The content of the nitrogen element of this composition is less than 100 ppm and its amount of COOH terminal groups is 20 eq./ton or less. The film for the backsheet of PV cells, made from this composition of PET resin, has sufficient long-term hydrolysis resistance. But this film is still has shortcomings, particularly in terms of resistance to UV.

An object of this invention consists in overcoming the defects of these conventional technologies and in providing a polyester composition suitable for producing films of which the properties are superior, especially transparency and haze, in hydrolysis resistance, in light stability, in ease of handling.

OBJECTIVES OF THE INVENTION

In this context, one of the essential objectives of this invention is to provide an improved biaxially oriented transparent polyester film that improves at least one of the following properties:
  (a) transparency;
  (b) easy handling, in particular thanks to the lowering of the coefficient of friction;
  (c) hydrolysis resistance;
  (d) light stability;
  (d) adhesion in particular at the interface between the film and other layers of the laminate in the structure of which said film can be incorporated.

Another objective of the invention is to provide a method for obtaining a polyester film which satisfies the above objectives, said method being simple to implement, cheap and industrial.

Another objective of the invention is to provide a PV panel or cell comprising the abovementioned improved film.

BRIEF DESCRIPTION OF THE INVENTION

These objectives, among others, are achieved by this invention which relates, in a first aspect to a multilayer biaxially oriented transparent film comprising at least two polyester layers, respectively a core layer and at least one outer layer, that can be same or different, wherein:

i) at least the core layer comprises at least one biaxially oriented transparent polyester PE1, preferably an aromatic polyester, and, more preferably, a polyethylene terephthalate, ii) at least one of the outer layers comprises, on the one hand, at least one biaxially oriented polyester PE2, preferably an aromatic polyester, and, more preferably, a polyethylene terephthalate, and, on the other hand, particles coming from the reaction between at least one metal compound and at least one monomeric or oligomeric unit of a precursor PE2" of PE2, said inner particles having more preferably a d50 understood in μm and according to an increasing order of preference between 0.5 and 5.0; between 1.0 and 4.0, and between 1.5 and 3.0.

In a first preferred embodiment, the polyester PE1 of the film according to the invention is a polyester PEα, preferably an aromatic polyester, and, more preferentially, a polyethylene terephthalate:

comprising an alkali metal phosphate in an amount of 1.3 mol/tonne to 3.0 moles/tonne, and phosphoric acid in an amount of 0.4 to 1.5 times (per mole) that of the alkali metal phosphate;

and wherein the increase of COOH in said PE1 measured before and after a wet-heating treatment performed at 155° C. for 4 hours under saturated steam, is 90 eq./ton or less.

In a second embodiment, the polyester PE1 of the film according to the invention PE1 is a polyester PEλ, more preferably an aromatic polyester, and, further more preferably, a polyethylene terephthalate, different from PEα.

According to a remarkable modality of the invention, applicable in particular to the 1$^{st}$ and to the 2$^{nd}$ aforementioned embodiments, at least one of the outer layers, comprises at least one PE2 and at least one PEα and/or at least one PEλ.

So that the transparency of the multilayer according to the invention is at a level that is acceptable by the market, the quantities of PE1 and of PE2 and the thickness of the layers are selected such that:

the Haze of the film is less than or equal to 3.0; more preferably to 2.5;

the Kd (dynamic coefficient of friction) is less than or equal to 0.65; more preferably to 0.55, and, further more preferably to 0.50.

The film according to the invention advantageously has special optical properties characterised by its ability to transmit the incident light.

As such, its Transmittance or TLT (Total Luminous Transmittance) measured through the sample falls within the following ranges provided here in an increasing order of preference in %: [80-100]; [84-97]; [86-95];

and/or the Haze (turbidity) measured on the film falls within the following ranges provided here in increasing order of preference and in %; [<5]; [<4]; [0.01-3].

The polyester film preferably has a thickness between 4 and 500 microns. The upper limit and the lower limit of the thickness of the film are more preferably 8 microns and 250 microns respectively. When the thickness of the film is within this interval, the film has a favourable mechanical resistance, in particular in light of the application of a cross-linked coating.

Advantageously, at least one of the layers of the multilayer film, more preferably at least one of the outer layers, comprises at least one light stabiliser.

in the group comprising—more preferably comprised by—: metal salts of carboxylic acids, organophosporous coming from the phosphoric acid and mixtures thereof;

more preferably in the sub-group comprising—more preferably comprised by—: metal salts of acetic acid, in particular lithium and calcium acetates, and trimethyl phosphate.

Still in reference to these particles, they are more preferably by-products, and, further more preferably, precipitates, e.g. catalytic precipitates, coming from the synthesis of PE2.

For this purpose, PE2 obtained by post-condensation in the solid state of at least one polyester PE2" are favoured, more preferably an aromatic polyester, and, further more preferably, a polyethylene terephthalate.

PE2" is as such a precursor prepolymer of PE2.

It is for example during the preparation of PE2" using two comonomers, namely for example the step of interchanging between the dimethyl terephthalate and the diethylene glycol, that the particles of the film according to the invention are obtained. These particles come from the reaction between one and/or the other of the comonomers, for example DMT (dimethyl terephthalate) and at least one of the reaction auxiliaries used, for example during the interexchange phase. These auxiliaries can be in particular, lithium acetate, calcium acetate and trimethyl phosphate.

In this example, the particles are therefore constituted of complex Lithium, Calcium and Phosphorus salts.

This origin of the particles allows for better interpenetration/cohesion between the particles and the macromolecular chains of the polyester, in relation to extrinsic particles introduced into the polyester, for example in a master batch. These intrinsic particles have in particular the following advantages:

Limit the de-cohesion induced during the elongations, leading to a decrease in the Haze and increase in TLT;

Limit the sensitivity to abrasion, which makes it possible to have thinner layers on the surface in order to better control and limit the Haze;

Improve the global performance of the film with regards to the hydrolysis by avoiding or by limiting the introduction of extrinsic particles.

Preferably, the film according to the invention comprises a core layer and at least one outer layer on one side of the core layer and at least one outer layer on the other side of the core layer.

Moreover, the film according to the invention satisfies at least one of the following remarkable specifications:

The yellowing of the film (delta b) measured before and after a UV aging treatment performed according to ISO 4892-3, method A, cycle 1, is within the following ranges provided here in an increasing order of preference: [<4]; [<3]; [<2];

the global planar SST modulus of the film (GPSM) is within the following ranges provided here in an increasing order of preference and in kgf/mm$^2$: [440-465]; [445-465]; [450-465];

the total thickness of the film is within the following ranges provided here in an increasing order of preference and in μm: [4-500]; [6-350]; [8-250];

it comprises at least one additive selected from the group comprising: flame retardants; radical scavengers (more preferably oligomeric or polymeric HALS); and mixtures thereof;

it comprises at least one coating on at least one of its side, said coating being obtained by coextrusion, coating, extrusion coating, corona treatment under ambient air or in the presence of gases, vacuum evaporation, plasma treatment or physicochemical vacuum deposition.

The invention also pertains to a method for manufacturing a multilayer biaxially oriented polyester film according to the invention, said method comprising:
(i) synthesising or implementing at least one PE1 and at least one PE2, such as defined hereinabove;
(ii) possibly pre-drying the polyesters;
(iii) heating the polyesters to melt them and make them malleable;
(iv) extruding the melted polyesters and processing into a multilayered film, more preferably by the bias of a flat die;
(v) quick cooling (quenching) and solidifying the multilayer film, more preferably on a cooling drum;
(vi) biaxial stretching in the longitudinal and transverse directions of the multilayer film, at a given stretching temperature Ts;
(vii) heat sealing by heating the biaxially stretched film at a given heating temperature Th.

In this method, Ts and/or Th are more preferably selected in such a way that the endothermic peak temperature, Tmeta, is maintained under 240° C., more preferably, between 180 to 230° C., further more preferably, between 180 to 220° C., in order to control the hydrolysis resistance of said polyester film.

The polyester film can be of a simple structure or coextruded AB, ABA or ABC or even a more complex structure in multilayers (with the symbols A, B and C corresponding to layers of a different nature and/or of a different composition).

The invention also relates to a laminate comprising the film according to the invention or obtained by the method according to the invention.

Preferably, the laminate according to the invention has a peeling strength (at) 90° on the interface between the film of this invention and other films of the laminate forming the rear surface (backsheet) of the PV panel wherein it is incorporated, which is greater than or equal to 4 N/15 mm.

The film according to the invention can be used for the manufacture of the rear surface of photovoltaic panels or for any other outdoor application that requires performance that makes it possible to sustainably resist outdoor exposure (rain, sun, temperature variations, etc.).

The invention therefore also relates to a transparent photovoltaic panel of which rear surface (backsheet) comprises the film according to the invention obtained by the method according to the invention or the laminate according to the invention.

Figure 2:
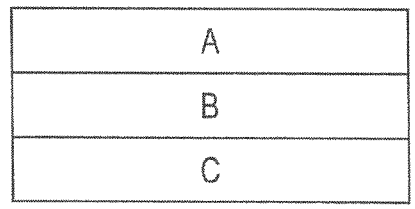

The FIG. 2 is a cross-section view showing an example of the multilayer transparent polyester film according to the invention.

Figure 3:
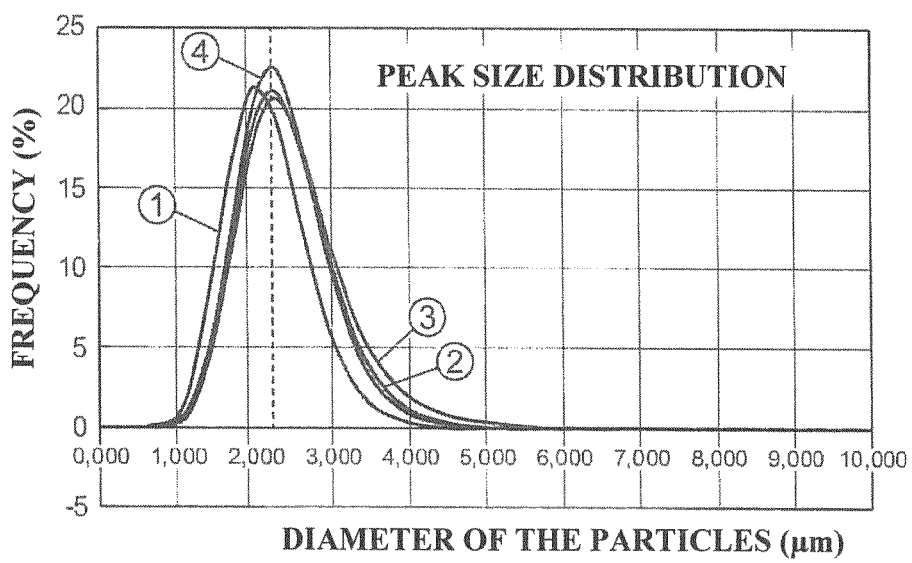

The FIG. 3 is a granulometric curve of the intrinsic particles contained in PE2.

DETAILED DESCRIPTION OF THE INVENTION

Note that in this text, any "singular" can be interpreted as a "plural" and vice versa.

The multilayer polyester film according to the invention is suitable for various applications such as magnetic material applications, electrical equipment applications, for example, capacitors, and packaging applications, outdoor decorative applications for buildings and in particular, PV cell applications for which at least one of the aforementioned properties (a)(b)(c)(d) is required.

Multilayer Transparent Polyester Film

Figure 1:
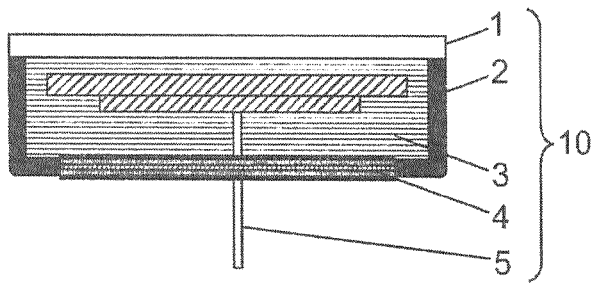
FIG. 1 is a cross-section view showing a cell of a photovoltaic panel (module) of which the backsheet comprises the multilayer transparent polyester film according to the invention.

For example, the multilayer transparent polyester film according to the invention can be a part of the rear surface (backsheet) of a photovoltaic module of which the structure is shown in FIG. 1. A photovoltaic module is a system that converts sunlight into electricity. Preferably, the structure of the photovoltaic cell comprises a total light transmission material (1) (glass, for example), a photovoltaic battery cell (2), a filled resin layer (3) (encapsulation layer), a rear protective laminate (4) of the photovoltaic cell (backsheet) and a lead wire (5). For transparent photovoltaic modules, the protective rear laminate (also called the rear surface or backsheet) is a transparent material.

This photovoltaic panel can be mounted on the roof of domestic or industrial buildings or used as windows or used to create electrical/electronic parts.

The film of the invention, part of the rear protective laminate (4) of the photovoltaic module, is shown in FIG. 2. This is a three-layer polyester film carried out more preferably using outer layers made of PET (A and C), and a core layer made of PET (B), which improves at least one of the 5 aforementioned properties (a)(b)(c)(d)(e).

The PET of the core layer B is a PET, designated as PE1.

The PET of outer layers A and C is a PET, designated as PE2.

PE1:

PE1=PEα

In the first preferred embodiment, the PE1 is a PEα formed by a polyester resin composition comprising an alkali metal phosphate as a phosphorous compound in an amount of 1.3 mol/tonne to 3.0 moles/tonne, and of phosphoric acid in the case of another phosphorous compound in an amount of 0.4 to 1.5 times (per mole) that of the alkali metal phosphate. From a point of view of the hydrolysis resistance, it is necessary for the polyester resin composition from this invention that its acid component contain an aromatic dicarboxylic acid component in an amount of 95 mol % or more. Especially, a terephthalic acid component is preferred in view of mechanical characteristics. It is also necessary, from the viewpoint of mechanical characteristics and thermal characteristics, that the glycol component contain a straight-chain alkylene glycol having 2 to 4 carbon atoms in an amount of 95 mol % or more.

Especially, ethylene glycol, which has two carbon atoms, is preferred from the viewpoint of mouldability and crystallisability. If the content of a copolymerised component exceeds 5 mol %, this will cause decrease in heat resistance due melting point depression and also cause decrease in hydrolysis resistance due to drop in degree of crystallisation. It is necessary from the viewpoint of hydrolysis resistance that the polyester resin composition of this invention contain an alkali metal phosphate in an amount of 1.3 mol/tonne to 3.0 moles/tonne. It is preferably 1.5 mol/tonne to 2.0 moles/tonne. When the content in alkali metal phosphate is less than 1.3 mol/tonne, the long-term hydrolysis resistance can be insufficient. On the other hand, when the alkali metal phosphate is contained in a content exceeding 3.0 moles/tonne, the latter is able to cause a heterogeneisation.

Examples of the alkali metal phosphate in this invention are sodium dihydrogen phosphate, disodium hydrogen phosphate, trisodium phosphate, potassium dihydrogen phosphate, dipotassium hydrogen phosphate, tripotassium phosphate, lithium dihydrogen phosphate, dilithium hydrogen phosphate, and trilithium phosphate.

Preferred are alkali metal dihydrogen phosphates and di(alkali metal) hydrogen phosphates. Alkali metal phosphates in which the alkali metal is Na or K are preferred from the viewpoint of long-term hydrolysis resistance. Particularly preferred are sodium dihydrogen phosphate and potassium dihydrogen phosphate. It is necessary from the viewpoint of long-term hydrolysis resistance that the content of the phosphoric acid in this invention should be 0.4 to 1.5 times of the alkali metal phosphate in a molar ratio. It is preferably 0.8 to 1.4 times. If it is less than 0.4 times, the long-term hydrolysis resistance may deteriorate. If it exceeds 1.5 times, a polymerisation catalyst will be deactivated by an excess of the phosphoric acid, and as a result polymerisation will be delayed and the amount of terminal COOH groups will increase, which will contribute to deteriorating the hydrolysis resistance of the polyester resin.

According to calculation from the contents of the alkali metal phosphate and the phosphoric acid, the polyester resin composition of the present invention contains an alkali metal element in an amount of 1.3 mol/tonne to 9.0 moles/tonne and a phosphorus element in an amount of 1.8 mol/tonne to 7.5 moles/tonne. In view of the type of a preferred alkali metal phosphate, the composition preferably contains an alkali metal element in an amount of 1.3 mol/ton to 6.0 mol/ton and phosphorus element in an amount of 1.8 mol/tonne to 7.5 mol/tonne.

From the viewpoint of reduction in the amount of terminal COOH groups and inhibiting of the formation of foreign bodies, it is preferred that the total content of the phosphorus compounds contained in the polyester resin composition of this invention be 30 ppm to 150 ppm in terms of the amount of phosphorus element. It is more preferably 60 ppm to 150 ppm.

It is preferred that the polyester resin composition PE1 contain a metal compound of which the metal element is at least one element selected from the group consisting of Na, Li and K, a metal compound of which the metal element is at least one element selected from the group consisting of Mg, Ca, Mn and Co, and a metal compound of which the metal element is at least one element selected from the group consisting of Sb, Ti and Ge, and the total amount of these metal elements is adjusted to 30 ppm or more and 500 ppm or less relative to the whole portion of the polyester resin composition. By adjusting the total amount of the metal elements to this range, the amount of terminal COOH groups can be reduced and heat resistance is improved. It is more preferably 40 ppm to 300 ppm. The elements Na, Li and K are alkali metal elements. The elements Mg, Ca, Mn and Co, which are divalent metal elements, play the role of a transesterification catalyst and confer electrostatic characteristics to the biaxially stretched film by affecting the resistivity of the polyester resin from which it came. Sb, Ti and Ge, which are metal elements having ability to catalyse polymerisation, function as a polymerisation catalyst.

It is also preferable that the polyester resin composition be a polyethylene terephthalate resin composition and that the increase in the amount of COOH terminal groups is within the range described hereinabove.

The polyester resin composition PE1 is more preferably a composition of polyethylene terephthalate, wherein the increase in the amount of the COOH terminal groups is 90 eq./tonne, more preferably, 20 eq./tonne or less, and, further more preferably, 15 eq./tonne or less, measured before and after a wet-heating treatment performed at 155° C. for 4 hours under saturated steam.

Since polyethyleneterephthalate is lower in crystallisability than polybutylene terephthalate and polybutylene naphthalate, crystallisation and whitening just after extrusion do not occur easily. Moreover, since polyethylene terephthalate has a glass transition temperature that is less and a stretch stress less than those of polyethylene naphthalate, it is superior in film mouldability, for example, it allows for easier stretch control. A polyethylene terephthalate resin having an increase in the amount of terminal COOH groups falling within the range indicated hereinabove has a long-term hydrolysis resistance that is higher than what polyethylene terephthalate inherently has.

It is preferred from the viewpoint of mechanical characteristics that the polyester resin composition PE1 have an intrinsic viscosity of 0.6 to 1.0. It is more preferably 0.7 to 0.9 from the viewpoint of reduction in the amount of terminal COOH groups and of the heat resistance.

It is preferred, from the point of view of inhibiting the formation of foreign bodies, that such a polyester resin composition have a nitrogen content of 100 ppm or less. In other words, it is preferred to contain substantially no terminal blocking agent that contains a nitrogen element, such as carbodiimide and oxazoline. A blocking agent reacts with a terminal COOH group and easily generates foreign bodies, such as gels, causing deterioration in mechanical characteristics.

It is preferred, from the point of view of maintaining the elongation, polymerisation reactivity, and mouldability, that the polyester resin composition of this invention contain a copolymerised component having three or more functionalities in an amount of 0.01 mol % to 1.00 mol % relative to all the acid components. It is more preferably 0.01 mol % to 0.50 mol %.

Examples of the copolymerised component having three or more functionalities include polycarboxylic acids such as trimellitic acid, cyclohexanetricarboxylic acid, biphenyl tetracarboxylic acid, pyromellitic acid, butanetetracarboxylic acid, trimer acids produced by trimerising long-chain aliphatic carboxylic acids, and their anhydrides and esters; polyhydric alcohols such as glycerol, pentaerythritol, dipentaerythritol, trimethylolpropane, ditrimethylolpropane, trihydroxybenzene and trihydroxyhexane; and polyhydroxycarboxylic acids such as citric acid, dihydroxybenzenecarboxylic acid, and dihydroxynaphthalene carboxylic acid, and their anhydrides and esters. In particular, it is preferred from the viewpoint of retention of elongation and film mouldability that the copolymerised component be a copolymerised component having three functionalities.

With regards to the process of adding such a copolymerised component having three or more functionalities, it is preferred from the viewpoint of reactivity and handling property to add it before transesterification in the cases of a polycarboxylic acid ester and a polyhydric alcohol component and to add it in the form of a solution or suspension (slurry) in ethylene glycol in the case of a polycarboxylic acid.

The method for producing the polyester resin composition PE1 is a method or producing a polyester resin composition by conducting a polycondensation via esterification or transesterification from an aromatic dicarboxylic acid and a straight-chain alkylene glycol having 2 to 4 carbon atoms, with the method comprising a first step of performing esterification or transesterification, a second step of adding additives such as a polymerisation catalyst and a phosphorus compound, and a third step of performing polymerisation. If necessary, a fourth step of performing solid phase polymerisation may be added.

In the first step, the esterification or transesterification can be performed by a conventional method using, for example, terephthalic acid, or dimethyl terephthalate and ethylene glycol. For example, when performing transesterification, a transesterification catalyst, such as magnesium acetate, calcium acetate, manganese acetate, and cobalt acetate, can be used, and antimony trioxide, which is a polymerisation catalyst, may also be added. During the step of esterification, the generation of diethylene glycol as a by-product is inhibited and also, hydrolysis resistance is improved if an alkali metal such as potassium hydroxide has been added in an amount of several ppm.

The second step is a step of adding additives such as a polymerisation catalyst and a phosphorus compound at a stage between the point of time when the esterification or transesterification has been substantially completed and the point of time when the intrinsic viscosity reaches 0.4.

As a polymerisation catalyst, a solution of germanium dioxide in ethylene glycol, antimony trioxide, titanium alkoxide, titanium chelate compounds, and so on can be used. It is necessary from the viewpoint of hydrolysis resistance that an alkali metal phosphate in an amount of 1.3 mol/tonne to 3.0 moles/tonne be added as a phosphorus compound. A preferred addition amount is 1.5 mol/tonne to 2.0 mol/tonne.

When the addition amount of the alkali metal phosphate is less than 1.3 mol/tonne, long-term hydrolysis resistance may be insufficient. On the other hand, when the alkali metal phosphate is added in an amount exceeding 3.0 mol/tonne, this is likely to cause heterogenisation. Moreover, from the viewpoint of inhibiting the formation of foreign bodies and long-term hydrolysis resistance, it is necessary to add phosphoric acid as a phosphorus compound in an amount of 0.4 to 1.5 times (by mole) that of the alkali metal phosphate. A preferred addition amount is 0.8 to 1.4 times.

If it is less than 0.4 times, the long-term hydrolysis resistance may deteriorate. If it exceeds 1.5 times, a polymerisation catalyst will be deactivated by the excess phosphoric acid, and this will result in a delay in the polymerisation, an increase in the amount of COOH terminal groups, which will contribute in deteriorating the hydrolysis resistance of the polyester resin.

If it is less than 0.4 times, the long-term hydrolysis resistance may deteriorate. If it exceeds 1.5 times, a polymerisation catalyst will be deactivated by the excess in such a way that the hydrolysis resistance may deteriorate.

In particular, it is desirable from the viewpoint of heat resistance and long-term hydrolysis resistance to adjust the amount of an alkali metal element to 1.3 mol/tonne or more and 6.0 mol/tonne or less and the amount of phosphorus element to 1.8 mol/tonne or more and 7.5 mol/tonne or less.

With regards to the method of adding phosphoric acid and the alkali metal phosphate, it is preferred, from the viewpoint of long-term hydrolysis resistance, to add and mix them after dissolving them in ethylene glycol or the like beforehand.

With regards to the types of the solvent or dispersing medium to be used at this time, it is preferred from the viewpoint of heat resistance and hydrolysis resistance to use the same alkylene glycol as the straight-chain alkylene glycol having 2 to 4 carbon atoms contained in the polyester resin composition of this invention. If another type of alkylene glycol is used, heat resistance may deteriorate due to the copolymerisation reaction.

In particular, it is preferred from the viewpoint of inhibiting the formation of foreign bodies to adjust the mixed liquid at this time to an acidic pH of 2.0 to 6.0. More preferably, the pH is 4.0 to 6.0.

It is preferred from the viewpoint of polymerisation reactivity to add the phosphorus compound at an interval of 5 minutes or more from the addition of the polymerisation catalyst, and it may be added either before or after the addition of the polymerisation catalyst.

Examples of other additives include magnesium acetate intended to alter the electrostatic characteristics, calcium acetate as a co-catalyst and antioxidants of the sterically hindered phenol type, which may be added as long as they do not impair the effect of this invention. Particularly, in the case of esterification, further addition of ethylene glycol such that the total amount of ethylene glycol may become 1.5 to 1.8 times the amount of terephthalic acid in molar ratio is effective for improving hydrolysis resistance because it can reduce the COOH terminal groups.

On the other hand, in order to impart a slipping property to the film in order to facilitate handling it, it is possible to add various types of particles or incorporate internally formed particles using a catalyst.

In the third step, the polymerisation can be performed by a conventional method. Moreover, in order to reduce the amount of terminal COOH groups, it is effective to adjust the polymerisation temperature up to a temperature that is 30° C. higher than the melting point of a polyester resin composition, and perform the solid phase polymerisation of the fourth step after temporarily forming chips that have an intrinsic viscosity IV of 0.5 to 0.6 dl/g.

In the fourth step, it is preferred to perform a solid phase polymerisation (SSP) at a temperature that is 30° C. to 60° C. lower with respect to the melting point of the polyester resin composition, and at a degree of vacuum of 0.3 Torr or less. The intrinsic viscosity IV of the polyester resin PE☐ post-condensed as such is greater than or equal to 0.8 dl/g. The polyester resin composition obtained as such can be subjected, after drying, to extrusion using a conventional extruder and to a biaxial stretching. At this time, the feeding of the extruder is preferably performed under an inert nitrogen atmosphere.

The film produced as such which is made of the polyester resin composition of this invention is not only low in content of terminal COOH groups and superior short-term hydrolysis resistance, but also superior in long-term hydrolysis resistance, which is needed for photovoltaic applications in particular, due to the action of the phosphoric acid and the alkali metal phosphate.

☞ PE1=PEλ

In this second embodiment, the PEλ is preferably an aromatic polyester, and, more preferably, a polyethylene terephthalate, different from PEα.

PEλ is for example:
  either comprised of polyethylene terephthalate,
  or formed of mixtures, or not, of polyethylene terephthalate copolyesters containing cyclohexyl dimethylol units instead of the ethylene units (see U.S. Pat. No. 4,041,206 or EP-A-0408042),
  or comprised of mixtures, or not, of polyethylene terephthalate copolyesters with a polyester portion having isophthalate units (see patent EP-B-0515096),
  or comprised of several layers of polyesters of different chemical natures, obtained e.g. via coextrusion.

Specific examples of aromatic polyesters are in particular polyethylene terephthalate (PET), polyethylene isophthalate, polybutylene terephthalate, poly-(dimethyl-1,4-cyclohexylene terephthalate) and polyethylene-2,6-naphthalenedicarboxylate. The aromatic polyester can be a copolymer of these polymers or a mixture of these polymers with a small quantity of other resins, for example and without being limited to, polybutylene terephthalate (PBT). Among these polyesters, polyethylene terephthalate (PET) and polyethylene-2,6-naphthalenedicarboxylate (PEN) are particularly preferred as they offer a good balance between physical properties, mechanical properties and optical properties.

The film of aromatic polyester is selected from among film-forming linear polyesters, crystallisable by orientation.

As examples of aromatic acids, lphthalic, terephthalic, isophthalic, 2,5-naphthalenedicarboxylic, and 2,6-naphthalenedicarboxylic acids can be mentioned. These acids can be combined with a smaller quantity of one or more aliphatic or cycloaliphatic dicarboxylic acids, such as adipic, azelaic, tetra- or hexahydroterephthalic acids. As non-limitative examples of aliphatic diols, ethylene glycol, 1,3-propanediol, 1,4-butanediol, cycloaliphatic diols (cyclohexanedimethanol), neopentylglycol can be mentioned. These diols can be used separately or as a combined mixture thereof. Preferably, the film-forming crystallisable polyesters are polyterephthalates or alkylenediol polynaphthalenedicarboxylates and, in particular, polyethylene terephthalate (PET) or 1,4-butanediol or copolyesters having at least 80 mol. % of ethylene glycol terephthalate units.

The film of aromatic polyester can be obtained by melting then extruding of granules of resin dried beforehand through a flat die. The layer of melted aromatic polyester is then cooled and solidified on a rotating cooling drum in order to obtain an unstretched sheet. The unstretched sheet is then subjected to a longitudinal and transversal stretching at a given stretching temperature Ts (such that Tg<Ts<heat sealing and controlling hydrolysis resistance.

In this method, Ts and/or Th are more preferably chosen in such a way that the endothermic peak temperature, Tmeta, is maintained below 240° C., more preferably, between 180 to 230° C., further more preferably, between 180 to 220° C., in order to control the hydrolysis resistance of said polyester film.

PE2:

The PE2 is obtained for example using a PET precursor PE2″. For the synthesising of PE2″, an addition is made for example of a mixture of dimethyl terephthalate and of diethylene glycol, 0.025 to 0.035% by weight of antimony trioxide, 0.085 to 0.95% by weight of calcium acetate, 0.165 to 0.185% by weight of lithium acetate and 0.175 to 0.190% by weight of trimethyl phosphate. The first step of the reaction is the transesterification or interexchange catalysed by the antimony trioxide. It is during this step of interexchange that the inner particles of the film according to the invention are obtained. These particles come from the reaction between the DMT (dimethyl terephtalate) and the 3 compounds introduced during the phase of interexchange, which are lithium acetate, calcium acetate and trimethyl phosphate. They are comprised by complex salts of lithium, calcium and phosphorus. For more details, refer to EP0310677B1 (page 8).

| Additives | Type |
| --- | --- |
| Calcium | Calcium acetate hydrate (CH3COO)$_2$Ca,0,5H20 |
| Lithium | Lithium acetate hydrate CH3COOLi, 2 H2O |
| Phosphorus | Trimethyl Phosphate (CH$_3$)$_3$PO$_4$ |

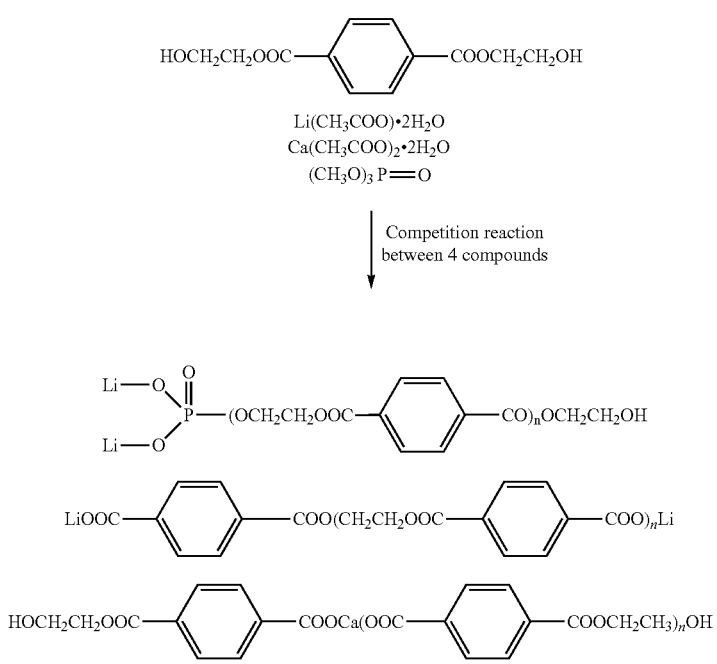

The second step in the reaction is a polycondensation performed according to the conventional methods in order to obtain a PET containing about 0.2% by weight of internal particles coming from catalytic precipitates. These internal particles have a granulometric distribution characterised by the curve shown in FIG. 3. Note that D50 is between 1.5 and 3.0 μm.

The PE2" is then subjected to a post-condensation or solid state polymerisation (SSP) such as described in Japanese patent application JP-H3229725. The intrinsic viscosity IV of the polyester resin PE2 post-condensed as such is greater than or equal to 0.8 dl/g.

Advantageously, the film according to the invention has an average retention rate of elongation after aging for 60 hours at 121° C. is between the following ranges given herein in an increasing order of preference: [>30%]; [>40%]; [>50%] or [>40%]; [>50%]; [>60%].

According to an interesting characteristic, the increase in the yellowing of the film (delta b) before and after a UV aging treatment performed according to ISO 4892-3, method A, cycle 1, is between the following ranges given herein in an increasing order of preference: [<4]; [<3]; [<2]

Light Stabiliser

According to the invention, at least one of the layers of the film, more preferably at least one of the outer layers of the film include preferably at least one UV light stabiliser selected from the group comprising UV absorbers of the triazine type and mixtures thereof; and wherein the total concentration in UV stabiliser is between the following ranges given herein in an increasing order of preference and in % in p/p: [0.01-35]; [0.03-25]; [0.05-20]; [0.1-10]; [0.1-5].

Light stabilisers are used for countering the effects of light (UV) and oxygen on the polyester film.

The light stabilisers can be selected from several groups of known products such as those described in the work "Additives for plastics on book, John Murphy, 2nd Edition 2001, Elsevier Advanced Technology" and more specifically for PET films such as those described in U.S. Pat. No. 6,593,406.

As examples of light stabilisers described in patent WO 2009/083552 A1, there may be mentioned:
- the family of antioxidants or UV absorbers such as benzophenones, benzotriazoles, benzoxazinones and triazines;
- the family of sterically Hindered Amine Light Stabilisers (HALS)), alone or in combination with antioxidants.

The polyester film will preferably comprise at least one light stabiliser additive, and, more preferably, an UV-absorber of the triazine type with two phenyl or two biphenyl groups (Tinuvin 1577 from BASF with RNCas 147315-50-2, Tinuvin 1600 from BASF (3-(diaryl)[1,3,5]triazin-2yl)-5-(alkoxy substituted phenol), Cyasorb UV-1164 from Cytec).

The light stabiliser can be advantageously introduced in the film from a Master Batch (UVMB), which is obtained by melting and mixing 85% by weight of a polyethylene terephtalate that has a very high intrinsic viscosity (IV>D/g) and 15% by weight of a light stabiliser in order to maintain a final IV above 0.80 do/g.

Alternative with Inorganic Fillers

According to a possibility of the invention, at least one of the outer layers incorporates filler particles which:
- are inorganic,
- are preferably selected from the group comprising and consisting of: particles of aluminium oxide, silicon dioxide, zirconium oxide, titanium dioxide, tin oxide, calcium carbonate, barium sulphate, calcium phosphate, zeolite, hydroxy apatite, aluminium silicate and mixtures thereof,
- preferably have a median diameter $d_{50}$, preferably between 0.03 μm to 5.5 μm; or preferably have an average particle size of about 0.03 μm to 5.5 or 6.0 μm,
- are preferably porous with a porous volume which is preferably >0.9 ml/g.

The most suitable incorporated inorganic particles are porous particles of $SiO_2$ which are preferably included in the outer layers to improve the ease in handling the film without increasing the haze (turbidity) of the film. The porosity and the average diameter $d_{50}$ of these particles of $SiO_2$ are indicated hereinabove in the brief description of the invention part.

Some fillers other than $SiO_2$ can be included in the polyester in order to modify its properties. These fillers can be included alone or as mixtures in the film. As examples of commonly known fillers for polyester films, there is calcium carbonate, calcium oxide, aluminium oxide, kaolin, silica, zinc oxide, carbon black, silicon carbide, tin oxide, particles of cross-linked acrylic resin, particles of cross-linked polystyrene resin, particles of cross-linked melamine resin, particles of cross-linked silicone resin or similar may be mentioned. Fillers of the silica and/or carbonate type are preferably used.

Moreover, if necessary, the polyester film can further contain at least one other additive, preferably selected from the following group: radical scavenger, flame retardant, dye, antistatic agent, antioxidant, organic lubricant, catalyst or any other similar additive.

Surface Treatment

The film of the invention can have a surface treatment on at least one side, in order to improve adhesion, antistatic performance, slip and winding performance. The surface treatment can be a physical surface treatment (for example UV, corona treatment under ambient air or in the presence of gases, vacuum evaporation, plasma treatment or plasma-assisted vapour phase chemical deposit), or a chemical surface treatment (for example coating of acrylic, copolyester, polyester or polyurethane based formulations).

The chemical surface treatment can be obtained by coextrusion, extrusion coating, in-line coating done prior to transverse stretching during the film making process or off-line coating.

Applications: Laminates

This invention encompasses laminates, in particular laminates for backsheets of photovoltaic panels. The laminates according to the invention have for example a peeling strength (90°) greater than or equal to 4N, which corresponds to improved adhesion properties on the interface between the film of the invention and the other layers of the rear surface (backsheet) of the PV panel wherein it is incorporated. Said peeling strength (90°) is measured according the method described hereinafter.

Properties Measured

Global Planar Sonic Modulus (GPSM)

The speed of the supersonic pulse is measured in a given direction over a given distance following the standard ASTM F89-68 for the determination of the sonic modulus of a flexible barrier material by sonic method, using an SST-250 sonic sheet tester manufactured by Nomura Shoji. Co. Ltd, Japan. A "modulus" is calculated using an empirical correlation:

$$E=92*v^2$$

with:

E=modulus in kgf/mm2 v=speed of ultrasound propagation in the sample in km/s

By rotating the sample progressively by 5° angle increments from 0° (MD) to 175° (TD+85°), a global planar SST modulus (GPSM) can be calculated from the average of the 36 individual measurements within the plane.

Intrinsic Viscosity

A sample solution is obtained by dissolution of a given quantity of the sample (polymer or film) at least at 120° C. for 30 min in 100 mL of a solvent mixture of 1,2-dichlorobenzene/phenol 50/50. After cooling down, the elution time of the sample solution is measured with an Ubbelohde viscosimeter. The intrinsic viscosity value IV of the sample is calculated is calculated according to the standard ISO 1628/5 using the following correlations.

The viscosity of the pure solvent mixture $\eta 0$ is compared to the viscosity of the sample solution $\eta$.

The relative viscosity $\eta r$ is given by:

$$\eta r = \eta/\eta 0 = t*\rho/t0*\rho 0$$

with:

t0 and $\rho 0$ are the elution time and density of the solvent mixture;

t and $\rho$ are the elution time and density of the sample solution.

Since $\rho \sim \rho 0$ in our case of study, the following equation for specific viscosity $\eta sp$ is therefore obtained: $\eta\ sp = \eta r - 1 = (t-t0)/t0$.

The correlation between $\eta sp$ and intrinsic viscosity IV is given by:

$$(\eta sp/C) = IV + k*IV^2*C$$

with:

($\eta$ sp/C): viscosity number.

C: concentration of polymer in the solution;

K: constant.

The intrinsic viscosity IV can be determined experimentally by measuring the viscosity number ($\eta$ sp/C) as function of concentration C. The intrinsic viscosity IV corresponds to the value of ($\eta$ sp/C) when the concentration approaches zero (infinite dilution).

Determination of the Amount of Phosphorus in a Polymer

Measurement was conducted using a fluorescent X-ray analyzer (Model No: 3270) manufactured by Rigaku Corporation.

Determination of the Amount of Alkali Metal in a Polymer

Measurement was carried out by an atomic absorption method (Polarized Zeeman Atomic Absorption Spectrophotometer 180-80, manufactured by Hitachi, Ltd., flame: acetylene-air).

COOH Content

The concentration of terminal carboxyl groups is measured by the so-called titration method. In particular, 0.5 g of sample are dissolved and cooled, add 3 ml of CH2Cl2.

Titration is performed with a KOH 0.02N solution.

A blank sample of solvent mixture o-cresol/H2O 17/1 is titrated by the same method.

The carboxyl group content [COOH] is calculated by the following equation:

$$(V-Vo)t/P;$$

Vo (L): KOH volume used for titration of blank sample;
P(g): sample weight;
V (L): KOH volume used for titration of sample;
t: KOH solution concentration (0.02N or 0.02 mol/l).

Thermal Properties.

The small endothermic peak temperature, Tmeta, mentioned hereinabove, is measured by differential scanning calorimetry (DSC Diamond of Perkin-Elmer). This method is used to study thermal transitions of polymers. The polymer is heated up to 250° C. (10° C./min) under nitrogen flow.

Hydrolysis Resistance

To characterise the hydrolysis resistance, the polyester film is subjected to accelerated aging in a PCT (Pressure Cooker Test) in a pressurised climate enclosure SYSTEC VE-100 with the following conditions: temperature 121° C., relative humidity 100%, pressure 2 bars. The retention ratio of Elongation to Break (EB) of the film is measured after 60 h of the aging test.

Light Stability

In order to characterise the light stability, the polyester film is subjected to an accelerated aging test in a UVCON device (Atlas) with test conditions according to ISO 4892-3 Method A, cycle 1:

type of lamp: 1 A (UVA340) (fluorescent lamp);

exposition cycle: after performing the ultraviolet irradiation (0.76 W·m$^{-2}$·nm-1 at 340 nm) at a temperature of 60° C. (+/−3° C.) in dry conditions for 8 hours, aging for 4 hours is performed in a dew condensation state at temperature 50° C. (+/−3° C.), in an atmosphere with relative humidity of 100% (light off). The exposition cycle is performed up to 1000 hours minimum (cf. table of examples hereinafter). After the ageing test, the retention ratio of elongation to break (EB) and the delta b* are measured in order to characterise the light stability of the film.

COF

Coefficient of Friction is measured according to ASTM D 1894 with the use of an apparatus consisting of a horizontal testing table, a sled, and a driving mechanism to produce a relative motion between the sled and the testing table. Friction represents the resistance that two surfaces lying in contact with each other build up against sliding.

Polyester film samples with identified sides were cut. One sample of polyester was attached, "A" surface up, onto a plate. Another piece of polyester film was mounted using double-sided tape to a sled of 63.5*63.5 mm and 200 g, with the "B" surface down. The sled was placed on top of the glass plate and attached to the load sensing device. The sled was then dragged over the film on the glass plate at 150 mm/min. The only contact during the testing was polyester film surface "A" rubbing against polyester film surface "B".

The measuring distance used to calculate the value of static Fs and dynamic Fd is a run of 130 mm.

The static coefficient of friction $\mu_S$ which corresponds to the "threshold value" at the onset of a sliding motion, is given by the equation:

$$k_S = F_S/F_P$$

where:

$F_S$ is the static frictional force in Newtons;
$F_P$ is the normal force exerted by the mass of the sled, in newtons=1.96 N.

The dynamic coefficient of friction $\mu_D$ which persists during a sliding motion at a given speed. is given by the equation:

$$k_D = F_D/F_P$$

where:

$F_D$ is the dynamic frictional force, in Newtons;
$F_P$ is the normal force exerted by the mass of the sled, in newtons=1.96 N.

Median Diameter of Particles $d_{50}$.

The median diameter of particles $d_{50}$ (expressed in μm) was measured with a laser on a masterSizer from Malvern using a standard method. For the tests, the specimens are placed in a cell with phosphated water (1 g/l of $Na_2P_2O_7 \cdot 10H_2O$). The cell is then placed in the test device. The test procedure is automatic and includes the mathematical determination of the value $d_{50}$. The $d_{50}$ is determined by the cumulative distribution curve of the size of the particles. The point of intersection of the ordinate 50% with the distribution curve directly gives the value $d_{50}$ on the axis of the abscissa.

Haze (Turbidity)

Haze characterises the diffusion of the light by the sample. The more it increases, the less transparency there is. The Haze is determined as percentage of transmitted light which deviates from the normal with respect to the surface of the film by an average amount greater than 2.50° of arc during passage through the film.

Transmittance or TLT (Total Luminous Transmittance)

In optics, the transmittance of a material if the fraction of the light flow passing through it. It is also referred to as factor of transmission and also transparency in the field of photography.

By noting $\phi_0$ as the incident flow and $\phi$ the flow transmits, then the transmittance is:

$$\mathcal{T} = \frac{\phi}{\phi_0}.$$

It can be measured over the entire visible range (total light transmittance or TLT) or around a given wavelength. If this transmittance varies according to the wavelength, then the filter appears coloured. Transmittance is commonly expressed as a percentage (0% for an opaque material).

Criteria of Evaluation

Retention Rate of Elongation after Hydrolytic Aging

The elongation to break is measured according to ASTM D-882, with dynamometer INSTRON 5543 provided with a detector of 1 kN. The dimension of the samples cut in the direction of the machine (MD) i.e. in the longitudinal direction of the film, is standardised 100*15 mm. The elongation to break before aging is considered to be equal to 100%.

The retention ratio of the elongation to break is calculated by the ratio of the elongation to break of the samples before aging. The retention ratio of the elongation to break is measured after 60 hours of PCT test in a pressurised climatic enclosure SYSTEC VE-100 at 121° C., under a RH of 100%, and under a pressure of 2 bars.

The samples are evaluated according to the following classification:
  A: the retention ratio is 60% or more: considered as good;
  B: the retention ratio is between 40 and 60%: considered as medium;
  C: the retention ratio is less than 40%: considered to be insufficient.

Delta b*

After performing the exposure acceleration test in a UVCON device, the coloration of the film is measured in terms of b* value by transmission measurement with a MINOLTA CM-508d spectrocolorimeter.

Colour measurements are done in accordance with ISO 7724 (March 1988) (specular reflection included—under D65 illuminant) and the difference between the b* value after the outdoor exposure acceleration test (1000 h in the UVCON) and the b* value before the outdoor exposure acceleration test is calculated:

Delta b*=b* after aging–b* before aging.

The samples are evaluated according to the following classification:
  A: Delta b* <2.0: significantly good light stability;
  B: Delta b* between 2 and 4: improved light stability;
  C: Delta b* >4: poor light stability.

Transmittance or TLT (Total Light Transmittance)

TTL is measured using a BYK-Gardner HazeGuard Plus hazemeter in accordance with ASTM D-1003.

The target film has for object to be transparent. It is evaluated according to the following TTL classification:
  A: TTL >88%: considered as good;
  B: TTL is between 80 and 88%: considered as medium;
  C: TTL <80%: considered as insufficient.

Haze (Turbidity))

Haze is determined according to ASTM D-1003 using the Hazegard® XL211 measuring instrument (manufactured by Byk Gardner). The lower the haze value, the better the optical properties of the films.

The film of this invention is evaluated according to the following classification:
  A: Haze <2.5%: considered as good;
  B: Haze between 2.5 and 3.5%: considered as medium;
  C: Haze >3.5%: considered as bad.

COF

The coefficient of friction is measured according to ASTM D 1894. Friction represents the resistance of the "A" surface of the polyester film sliding against the "C" surface of the polyester film (with surfaces A and C defined in FIG. 2).

The film of this invention aims to obtain a dynamic coefficient of friction $\mu_D$ according to the following classification:
  A: dynamic coefficient of friction $\mu_D$<0.50: considered as good, the film is easy to handle;
  B: dynamic coefficient of friction $\mu_D$ is between 0.50 and 0.65: considered as medium;
  C: dynamic coefficient of friction $\mu_D$>0.65%: considered as unacceptable, the film is difficult to handle and is subject to blocking phenomena during the steps of conversion.

Global Planar SST (Sonic Sheet Tester) Modulus of the Film (GPSM).

The GPSM is measured according to ASTM F89-68 and it is expressed in kgf/mm2.

The film of this invention aims to obtain a GPSM according to the following classification:
  A: GPSM >450 kgf/mm2: considered as good;
  B: GPSM between 440 and 450 kgf/mm2: considered as medium;
  C: GPSM >440 kgf/mm2: considered as unacceptable.

Peel Strength

The behaviour of film when used in a laminate was tested by means of an adhesion test. The film side intended to be laminated is corona treated before adhesive deposit (5 μm). A urethane adhesive (Takerakku A-1106/Takeneto A-23, 6/1) is dried for 45 s at 45° C. An aging of 96 hours at 50° C. is performed on sample (15 mm wide).

Peeling strength is measured at 200 mm/min., with a peeling angle in the machine direction (MD).

Peeling strength is determined according to the following classification:

A: peeling strength >5 N: good adhesion;
B: peeling strength of 4-5 N: medium adhesion;
C: peeling strength <4N: unacceptable adhesion.

DETAILED EXAMPLES

The films of the examples and comparative examples hereinafter are all biaxially-oriented multilayer transparent films that comprise at least two layers of polyester, respectively a core layer comprising biaxially-oriented transparent PET PE1 and at least one outer layer comprising biaxially-oriented transparent PET PE2. When there are 2 outer layers, they can be identical or different.

The films were evaluated in relation to the TLT, Haze, hydrolysis resistance (retention ratio of the elongation), the light stability (delta b*), to COF and to adhesion. Consequently, the films were subjected to an accelerated aging test in a UVCON (Atlas) device under test conditions according to ISO 4892-3, and to an accelerate PCT aging test in a pressurised climatic enclosure SYSTEC VE-100 The results are presented in table 1.

Example 1

Granules of a polyester resin composition that have a superior long-term hydrolysis resistance PEα (PE1), comprising an alkali metal phosphate in an amount of 1.7 mol/tonne and phosphoric acid in an amount of 0.66 times (per mole) that of the alkali metal phosphate and wherein the amount of the COOH terminal groups is 11 eq./tonne, granules of UV absorber master batch (UVMB) and granules of polyester PE2 were dried, melted and extruded through a flat die on a rotating cooling drum in order to provide an unstretched three-layer transparent film. The unstretched three-layer transparent film was subjected to a longitudinal and transversal stretching at a given stretching temperature Ts and finally exposed to a heat-setting temperature Th for the purposes of heat setting and controlling the hydrolysis resistance. The low endothermic peak corresponding to Tmeta is measured at 215° C.

The UV absorber master batch (UVMB) is comprised of 20% Tinuvin 1577® and 80% polyethylene terephthalate with an intrinsic viscosity greater than 0.80 do/g and a concentration of carboxylic groups less than 28 eq./T.

The polyester PE2 contains about 0.2% by weight of particles coming from the reaction between at least one metal compound and at least one monomeric or oligomeric unit of a precursor PE2" of PE2, said internal particles having more preferably a d50 of 2.2 μm.

The transparent film with 3 layers obtained, comprising 1.5% of UV absorber (Tinuvin 1577® BASF), has an intrinsic viscosity, IV of 0.695 do/g and a global planar modulus (GPSM) of 451 kgf/mm². The total thickness of the film is 50 μm. The thicknesses of the layers A and C are 0.3 μm respectively. The proportion of PE2 in the layers A and C is 40% by weight.

This film is classed A for all of the performance levels presented in the table 1.

Example 2

Granules of a polyester resin composition that have a superior long-term hydrolysis resistance PEα (PE1) identical to that used in the example 1, granules of UV absorber master batch (UVMB) and granules of polyester PE2 were dried, melted and extruded through a flat die on a rotating cooling drum in order to provide an unstretched three-layer transparent film. The unstretched three-layer transparent film was subjected to a longitudinal and transversal stretching at a given stretching temperature Ts and finally exposed to a heat-setting temperature Th for the purposes of heat setting and controlling the hydrolysis resistance. The low endothermic peak corresponding to Tmeta is measured at 213° C.

The UV absorber master batch (UVMB) is identical to that used in the example 1.

The polyester PE2 is identical to that used in the example 1.

The transparent film with 3 layers obtained, comprising 1.5% of UV absorber (Tinuvin 1577® BASF), has an intrinsic viscosity, IV of 0.694 do/g and a global planar modulus (GPSM) of 452 kgf/mm². The total thickness of the film is 50 μm. The thicknesses of the layers A and C are 0.6 μm respectively. The proportion of PE2 in the layers A and C is 25% by weight.

This film is classed A for all of the performance levels presented in the table 1.

Example 3

Granules of a polyester resin composition that have a superior long-term hydrolysis resistance PEα (PE1) identical to that used in the example 1, granules of UV absorber master batch (UVMB) and granules of polyester PE2 were dried, melted and extruded through a flat die on a rotating cooling drum in order to provide an unstretched two-layer transparent film. The unstretched two-layer transparent film was subjected to a longitudinal and transversal stretching at a given stretching temperature Ts and finally exposed to a heat-setting temperature Th for the purposes of heat setting and controlling the hydrolysis resistance. The low endothermic peak corresponding to Tmeta is measured at 214° C.

The UV absorber master batch (UVMB) is identical to that used in the example 1.

The polyester PE2 is identical to that used in the example 1.

The transparent film with 2 layers obtained, comprising 1.5% of UV absorber (Tinuvin 1577® BASF), has an intrinsic viscosity, IV of 0.695 do/g and a global planar modulus (GPSM) of 451 kgf/mm². The total thickness of the film is 50 μm. The thickness of the outer layer A is 1.2 μm. The proportion of PE2 in the layers A and C is 25% by weight.

This film is classed A for all of the performance levels presented in the table 1.

Example 4

Granules of a polyester resin composition that have a superior long-term hydrolysis resistance PEα PE1, comprising an alkali metal phosphate in an amount of 1.7 mol/tonne and phosphoric acid in an amount of 0.66 times (per mole) that of the alkali metal phosphate and wherein the amount of the COOH terminal groups is 11 eq./tonne and granules of polyester PE2 were dried, melted and extruded through a flat die on a rotating cooling drum in order to provide an unstretched two-layer transparent film. The unstretched two-layer transparent film was subjected to a longitudinal and transversal stretching at a given stretching temperature Ts and finally exposed to a heat-setting temperature Th for the purposes of heat setting and controlling the hydrolysis resistance. The low endothermic peak corresponding to Tmeta is measured at 215° C.

The polyester PE2 contains about 0.2% by weight of particles coming from the reaction between at least one metal compound and at least one monomeric or oligomeric unit of a precursor PE2" of PE2, said internal particles having more preferably a d50 of 2.2 μm.

The transparent film with 2 layers obtained has an intrinsic viscosity, IV of 0.695 do/g and a global planar modulus (GPSM) of 451 kgf/mm². The total thickness of the film is 50 μm. The thickness of the outer layer A is 1.2 μm. The proportion of PE2 in the layer A is 25% by weight.

The yellowing of the film is not acceptable with a delta b* of 4 after 1000 h of aging.

The results are presented in the table 1.

Example 5

Granules of a polyester resin composition that have a superior long-term hydrolysis resistance PEα (PE1) identical to that used in the example 1, granules of UV absorber master batch (UVMB) and granules of polyester PE2 were dried, melted and extruded through a flat die on a rotating cooling drum in order to provide an unstretched three-layer transparent film. The unstretched three-layer transparent film was subjected to a longitudinal and transversal stretching at a given stretching temperature Ts and finally exposed to a heat-setting temperature Th for the purposes of heat setting and controlling the hydrolysis resistance. The low endothermic peak corresponding to Tmeta is measured at 213° C.

The UV absorber master batch (UVMB) is identical to that used in the example 1.

The polyester PE2 is identical to that used in the example 1.

The transparent film with 3 layers obtained, comprising 1.5% of UV absorber (Tinuvin 1577® BASF), has an intrinsic viscosity, IV of 0.695 do/g and a global planar modulus (GPSM) of 452 kgf/mm². The total thickness of the film is 50 μm. The thicknesses of the layers A and C are 0.3 μm respectively. The proportion of PE2 in the layers A and C is 90% by weight.

The transparency of the film is not acceptable with a Haze value of 4%

The results are presented in the table 1.

Example 6

Granules of a polyester resin composition PEλ (PE1) without alkali metal phosphate and wherein the amount of the COOH terminal groups is 34 eq./tonne, granules of UV absorber master batch (UVMB) and granules of polyester PE2 were dried, melted and extruded through a flat die on a rotating cooling drum in order to provide an unstretched three-layer transparent film. The unstretched three-layer transparent film was subjected to a longitudinal and transversal stretching at a given stretching temperature Ts and finally exposed to a heat-setting temperature Th for the purposes of heat setting and controlling the hydrolysis resistance. The low endothermic peak corresponding to Tmeta is measured at 213° C.

The UV absorber master batch (UVMB) is identical to that used in the example 1.

The polyester PE2 is identical to that used in the example 1.

The transparent film with 3 layers obtained, comprising 1.5% of UV absorber (Tinuvin 1577® BASF), has an intrinsic viscosity, IV of 0.58 do/g and a global planar modulus (GPSM) of 452 kgf/mm². The total thickness of the film is 50 μm. The thicknesses of the layers A and C are 4 μm respectively. The proportion of PE2 in the layers A and C is 12% by weight.

The transparency of the film is averaged with a Haze value of 3.35%.

The film is impossible to handle because the COF cannot be measured (kd>1). The retention ratio of elongation to break, measured in the direction MD (machine direction) after 60 h of accelerated PCT test in a pressurised climatic enclosure SYSTEC VE-100, is 9% (60 h PCT). The hydrolysis resistance of the film is unacceptable for a photovoltaic application for example.

The results are presented in the table 1.

TABLE 1

| Requirement | Example 1 | Example 2 | Example 3 | Example 4 | Example 5 | Example 6 |
|---|---|---|---|---|---|---|
| TLT | A | A | A | A | B | A |
| Haze | A | A | A | A | C | B |
| Retention of elongation MD (60 h PCT) | A | A | A | A | A | C |
| Delta b * (1000 h UV aging) | A | A | A | C | A | A |
| COF | A | A | A | A | A | |
| Peeling strength | A | A | A | A | B | A |

Of course, the invention is not limited to the embodiments described and represented hereinabove, which can be used to provide for other modes and embodiments, without however leaving the scope of the invention.

The invention claimed is:

1. Transparent multilayered film, biaxially stretched, comprising at least 2 layers of polyester including a core layer and at least one outer layer, wherein:
   i) at least the core layer contains at least a transparent biaxially oriented polyester PE1 that is a polyester PEα:
      comprising an alkali metal phosphate in a concentration of 1.3 mole/ton to 3.0 mole/ton, and phosphoric acid in a concentration of 0.4 to 1.5 times (per mole) the concentration of the alkali metal phosphate, and
      in which an increase of COOH in PE1 between before and after a wet-heating treatment performed at 155° C. for 4 hours under saturated steam is 90 eq./ton or less,
   ii) the at least one outer layer comprises at least a biaxially oriented polyester PE2, and particles formed during formation of PE2 by reaction between at least one metallic compound and at least a monomer or oligomer unit of a precursor PE2" of PE2, wherein the metallic compound that is able to react with the at least one monomer or oligomer unit of the precursor PE2", in order to form the particles, is selected from a group consisting of metallic salts of carboxylic acids, organophosphates derived from phosphoric acid, and blends thereof, the particles have a d50 in μm of from 1.5 to 3, and the PE2 is obtained by solid state post-condensation from the precursor PET';

iii) at least one of the at least one outer layers comprises at least the PE2 and at least the PE1; and iv) at least one of the core layer and the at least one outer layer(s) includes a photo stabilizer.

2. A film according to claim 1, wherein the film comprises the core layer and at least one of the outer layers on each of opposite sides of the core layer.

3. A method of manufacturing a multilayer biaxially oriented polyester film according to claim 1, the manufacturing method comprising:

(i) synthesis or implementation of at least one of the PE1 and at least one of the PE2;

(ii) optional pre-drying of the polyesters;

(iii) heating the polyesters to form molten polyesters that are malleable;

(iv) extruding the molten polyesters to form the multilayer film;

(v) quenching and solidifying the multilayer film;

(vi) bi-axial stretching the multilayer film in longitudinal and transverse directions of the multilayer film, at a given stretching temperature Ts; and (vii) heating the biaxially stretched film at a given heating temperature Th.

4. A laminate comprising the film according to claim 1.

5. Transparent photovoltaic panel, whose rear surface (backsheet) comprises the film according to claim 1.

6. A film according to claim 1, wherein a proportion of PE2 and the particles in the at least one of the outer layers, and a total thickness of the outer layer(s) comprising PE2 and the particles, are such that:

the haze of the film is less than or equal to 2.5; and the Kd (dynamic friction coefficient) of the film is less or equal to 0.5.

7. A film according to claim 1, wherein a proportion of PE2 and the particles in the at least one of the outer layers, and a total thickness of the outer layer(s) comprising PE2 and the particles, are such that:

a haze of the film is less than or equal to 3.0; and

Kd (dynamic friction coefficient) of the film is less or equal to 0.65.

* * * * *